United States Patent
Lim et al.

(10) Patent No.: US 7,662,683 B2
(45) Date of Patent: Feb. 16, 2010

(54) METHOD FOR FORMING GATE DIELECTRIC LAYER

(75) Inventors: Jung Wook Lim, Daejeon-Shi (KR); Sun Jin Yun, Daejeon-Shi (KR); Jin Ho Lee, Daejeon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 672 days.

(21) Appl. No.: 10/909,339

(22) Filed: Aug. 3, 2004

(65) Prior Publication Data

US 2005/0142712 A1   Jun. 30, 2005

(30) Foreign Application Priority Data

Dec. 24, 2003   (KR) ...................... 10-2003-0096042

(51) Int. Cl.
- H01L 21/336 (2006.01)
- H01L 21/8234 (2006.01)
- H01L 21/3205 (2006.01)
- H01L 21/31 (2006.01)
- H01L 21/469 (2006.01)

(52) U.S. Cl. .................. 438/197; 438/591; 438/758; 438/787

(58) Field of Classification Search ................. 438/197, 438/591, 585, 594, 756, 778, 787, 758
See application file for complete search history.

(56) References Cited

U.S. PATENT DOCUMENTS

| | | | |
|---|---|---|---|
| 6,284,580 B1 | 9/2001 | Takehiro | |
| 6,395,650 B1 * | 5/2002 | Callegari et al. | 438/785 |
| 6,448,192 B1 * | 9/2002 | Kaushik | 438/785 |
| 6,573,193 B2 | 6/2003 | Yu et al. | |
| 6,699,725 B2 * | 3/2004 | Lee | 438/3 |
| 6,940,114 B2 * | 9/2005 | Oh et al. | 257/296 |
| 6,998,317 B2 * | 2/2006 | Ono | 438/287 |
| 7,153,744 B2 * | 12/2006 | Chen et al. | 438/267 |
| 7,423,286 B2 * | 9/2008 | Handy et al. | 257/48 |
| 2004/0004244 A1 * | 1/2004 | Ahn et al. | 257/314 |
| 2004/0082171 A1 * | 4/2004 | Shin et al. | 438/689 |

(Continued)

FOREIGN PATENT DOCUMENTS

JP   04-043642   2/1992

(Continued)

OTHER PUBLICATIONS

Yong Woo Choi, et al.; "*Effects of inductively coupled plasm oxidation on the properties of poly crystalline silicon films and thin film transistor*"; Applied Physics Letters; vol. 74, No. 18; May 3, 1999; pp. 2693-2695.

*Primary Examiner*—Chuong A. Luu
(74) *Attorney, Agent, or Firm*—Lowe Hauptman Ham & Berner, LLP

(57) ABSTRACT

Provided is a method for forming a gate dielectric layer, in which a plasma oxide layer is finely formed by plasma at a temperature of 200° C. or below, and an atomic layer deposition (ALD) oxide layer is deposited. Further, the gate dielectric layer according to the present invention can be applied to a display device comprising a substrate such as a plastic substrate vulnerable to heat, have good interfacial characteristic, and allow a high dielectric layer to be applied thereto.

15 Claims, 3 Drawing Sheets

U.S. PATENT DOCUMENTS

| | | | |
|---|---|---|---|
| 2004/0094808 A1 * | 5/2004 | Joshi et al. | 257/405 |
| 2005/0181535 A1 * | 8/2005 | Yun et al. | 438/99 |

FOREIGN PATENT DOCUMENTS

| | | |
|---|---|---|
| KR | 2002-01337 | 1/2002 |
| KR | 1020020001337 | 1/2002 |
| KR | 2003-50678 | 6/2003 |

* cited by examiner

Al₂O₃/Si Substrate

Al₂O₃/SiO₂/Si Substrate

METHOD FOR FORMING GATE DIELECTRIC LAYER

BACKGROUND

1. Field of the Invention

The present invention generally relates to a method for forming a gate dielectric layer of a thin film transistor, and more particularly, a method for forming a gate dielectric layer, in which the gate dielectric layer is formed by finely forming a plasma oxide layer by plasma and depositing an atomic layer deposition (ALD) oxide layer, thereby enhancing interfacial characteristics and decreasing current leakage.

2. Discussion of Related Art

In a display, particularly, in an active matrix type display, importance of a thin film transistor is large. To make a high performance display, the thin film transistor should have low current-leakage, high electron mobility, high on/off-currents ratio, and low threshold voltage. Such characteristics are swayed by a gate dielectric layer. That is, an interface state between the gate dielectric layer and silicon (or poly-silicon), and an internal defect, dopant, etc. of the gate dielectric layer have an effect on the performance of the thin film transistor.

In a recent display, a transparent glass substrate is employed for a backlight and a plastic substrate is also being tried in a future flexible display that can be bent or rolled up. In the case of the glass substrate, a fabricating process thereof needs a temperature of 600° C. or below. On the other hand, in the case of the plastic substrate, a fabricating process thereof needs a temperature of 200° C. or below.

Hitherto, the gate dielectric layer has been deposited on amorphous silicon or poly silicon, wherein silicon dioxide ($SiO_2$) has been known as a material having a best interfacial characteristic for the gate dielectric layer, particularly, it is the most excellent when the silicon dioxide ($SiO_2$) is formed by a thermal oxide layer.

However, in the case of the thermal oxide layer, a growth process thereof needs a high temperature of 800° C. or more, so that its actual application is difficult. Accordingly, there has been proposed a method of allowing the silicon dioxide ($SiO_2$) to be characterized near the thermal oxide layer, using oxygen plasma at a low temperature.

In the case of using the oxygen plasma, a growth rate of the silicon dioxide ($SiO_2$) is very low due to the low temperature and relatively much power is needed, so that it is difficult to form the gate dielectric layer, used in a display transistor having a thickness of 100 nm, as a single layer.

For example, there is a research that the silicon dioxide ($SiO_2$) is grown on the poly silicon substrate by a plasma process to obtain an oxide layer near to the thermal oxide layer, wherein the oxide layer with a thickness of 10 nm is grown using a radio frequency (RF) power of 900 W at a temperature of 350° C. [IEEE Electron Device Letters, 23, pp 333 (2002)]. However, this research is carried out with respect to a 4-inch wafer, so that a relatively large 12-inch wafer needs nine times more power than that for the 4-inch wafer. Besides, its processing temperature is still high.

Here, the processing temperature can be lowered to a normal temperature when a physical deposition process such as ion plating or sputtering is used. However, the physical deposition process causes an interface to be damaged, thereby deteriorating the interfacial characteristic. Further, when the physical deposition process is applied to the relatively large wafer, uniformity is not good as compared with a chemical deposition process, so that it is difficult to actually utilize the physical deposition process.

Meanwhile, the chemical deposition process for depositing the silicon oxide layer includes an atmospheric pressure chemical vapor deposition (APCVD) process, a low pressure chemical vapor deposition (LPCVD) process, and a plasma enhanced chemical vapor deposition (PECVD) process. Here, the APCVD process using silane ($SiH_4$) and oxygen ($O_2$) is performed at a temperature of 400° C.~450° C., and the silicon oxide layer deposition using inductively coupled plasma (ICP) is performed at a temperature of 400° C. [Applied Physics Letters, 74, pp 2693 (1999)].

However, such chemical deposition process is performed at a relatively high temperature, so that it cannot be applied to the plastic substrate. Further, when the chemical deposition process is applied to the relatively large wafer, not only the uniformity with regard to the relatively large wafer is not good, but also problems arise in reproducibility and reliability.

To solve the above-mentioned problems, there has been being researched a method of forming the silicon oxide layer using an atomic layer deposition (ALD) process. In the ALD process, a source is absorbed below a source decomposition temperature, and reaction gas is introduced to induce surface reaction, thereby depositing a thin film. Thus, the ALD process is performed below the source decomposition temperature, so that the uniformity with regard to the relatively large wafer is good, and the reproducibility and the reliability are relatively excellent.

Currently, plasma is used to enhance reactivity of the reaction gas, thereby fabricating a good thin film. For example, there is a research as to zirconium dioxide ($ZrO_2$) deposited by a plasma enhance atomic layer deposition (PEALD) process at a temperature of 250° C. [Journal of Applied Physics, 92, pp 5443 (2002)]. However, there is very little research as to the silicon dioxide ($SiO_2$) deposited by on the PEALD process. Also, there is very little research as to the lower temperature deposition below 200° C. or less.

Further, an application of a high dielectric layer is being researched for a semiconductor gate dielectric layer, but a problem arises in compatibility with the silicon substrate, that is, an wanted interlayer may be formed an interface, or current leakage due to crystallization may be increased. Hence, there is needed a method of avoiding direct contact between the gate dielectric layer and the silicon substrate.

SUMMARY OF THE INVENTION

Accordingly, the present invention is directed to a method for forming a gate dielectric layer at a low temperature, particularly, at a temperature of 200° C. or less.

The present invention is also directed to a method for forming a gate dielectric layer, in which the gate dielectric layer can be applied to a display device comprising a substrate such as a plastic substrate vulnerable to heat, have good interfacial characteristic, and allow a high dielectric layer to be applied thereto.

One aspect of the present invention is provide a method for forming a gate dielectric layer, the method comprising: forming a plasma oxide layer on silicon by plasma at a temperature of 200° C. or below; and depositing an ALD oxide layer by ALD process or PEALD process at a temperature of 200° C. or below. Here, the ALD oxide layer inclusively indicates an oxide layer that is deposited by the ALD process or PEALD process.

According to an embodiment of the present invention, the method further comprises forming a high dielectric layer after depositing the ALD oxide layer. Preferably, the plasma oxide layer and the ALD oxide layer are deposited by in-situ. Further, the high dielectric layer includes aluminum oxide ($Al_2O_3$), titanium oxide ($TiO_2$), tantalum oxide ($Ta_2O_5$), hafnium oxide ($HfO_2$), zirconium oxide ($ZrO_2$), or a silicate layer formed by combination of silicon dioxide ($SiO_2$) and at least one of $Al_2O_3$, $TiO_2$, $Ta_2O_5$, $HfO_2$, $ZrO_2$.

Preferably, the plasma oxide layer has a thickness of 2 nm~10 nm, and the ALD oxide layer has a thickness of 50 nm~150 nm.

The gate dielectric layer according to the present invention is not limited to and may vary as long as a forming process requires a low temperature. Particularly, the gate dielectric layer can be employed in a thin film transistor of various displays, so that the thin film transistor can have good interfacial characteristic. Also, the high dielectric layer can be applied to the gate dielectric layer, thereby enhancing the whole characteristics of the device.

Another aspect of the present invention is to provide a method for forming a gate dielectric layer, the method comprising: forming a plasma oxide layer on silicon by plasma at a temperature of 200° C. or below; and depositing a high dielectric layer by ALD or PEALD at a temperature of 200° C. or below.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
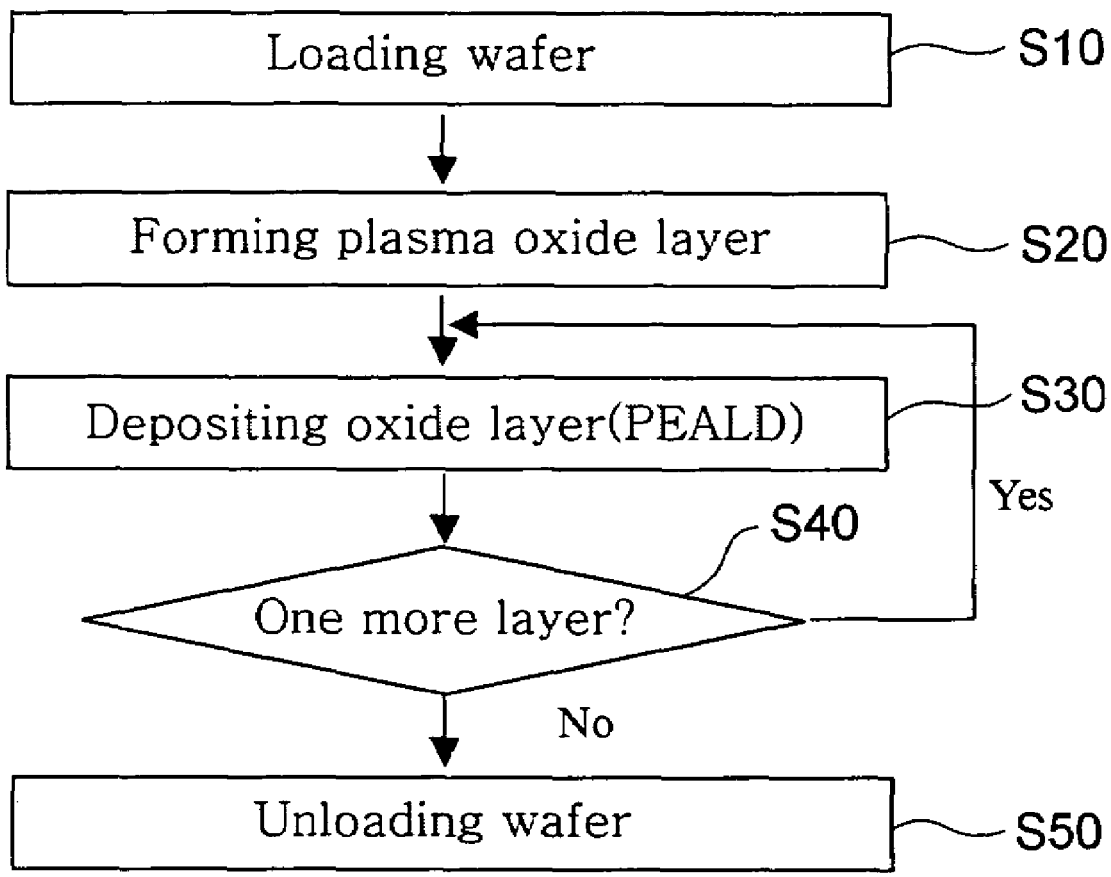
FIG. 1 is a flowchart of forming a gate dielectric layer according to an embodiment of the present invention.

Hereinbelow, a process of forming a gate dielectric layer according to an embodiment of the present invention will be described with reference to FIG. 1. FIG. 1 is a flow chart of forming the gate dielectric layer according to an embodiment of the present invention.

At operation S10, a substrate is loaded into a chamber ahead of forming the gate dielectric layer. At operation S20, a plasma oxide layer is formed using oxygen plasma. At operation S30, an ALD oxide ($SiO_2$) layer or a high dielectric layer is deposited by a plasma-enhanced atomic layer deposition (PEALD) process. Alternatively, the high dielectric layer may be deposited on the ALD oxide layer, thereby forming a tri-laminar structure. That is, in the case where one more layer is needed at operation S40, the high dielectric layer is deposited by in-situ. When the deposition is completed, at operation S50, the substrate is unloaded from the chamber.

Figure 2:
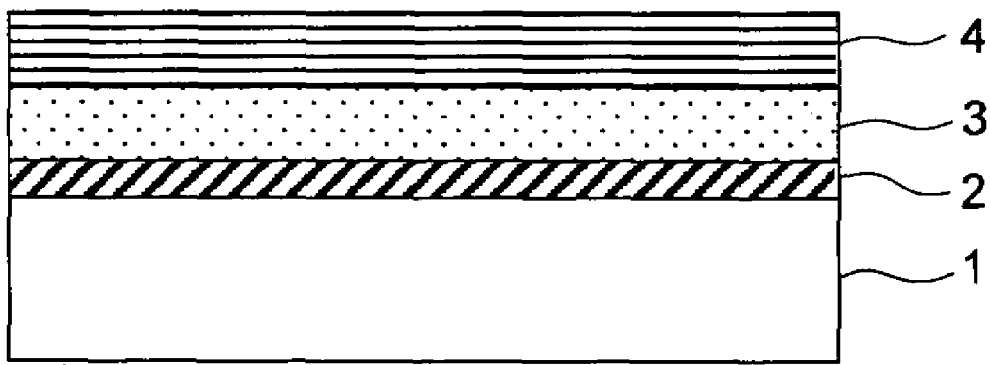
FIG. 2 is a cross sectional view of a gate dielectric layer according to an embodiment of the present invention.

FIG. 2 is a cross sectional view of a gate dielectric layer according to an embodiment of the present invention.

A silicon layer 1 for the gate dielectric layer is made of poly silicon or amorphous silicon. The oxygen plasma is generated on the silicon layer 1, so that the plasma oxide layer 2 is grown with a thickness of 2 nm~10 nm at a low temperature. The plasma oxide layer 2 is grown. Such plasma oxide layer 2 is appreciate for being deposited with a thickness of 2 nm~10 nm at a low temperature of 200° C. or below. Such plasma can include oxygen, nitrogen, and argon. Here, the silicon layer 1 is formed on a general substrate. For example, the substrate includes a silicon substrate, a glass substrate, etc. Further, a plastic substrate or the like having a relatively low melting point is possible because the present process is performed in a low temperature.

Then, the ALD oxide layer is grown on the plasma oxide layer 2 by the ALD process or the PEALD process. Here, the ALD oxide layer 3 is deposited with a thickness of 50 nm~150 nm at a low temperature by the PEALD process or the ALD process for good thin film density. Further, in order to get a higher dielectric constant, the high dielectric layer can be formed on the plasma oxide layer 2. Here, the high dielectric layer includes aluminum oxide ($Al_2O_3$), titanium oxide ($TiO_2$), tantalum oxide ($Ta_2O_5$), hafnium oxide ($HfO_2$), zirconium oxide ($ZrO_2$), etc. Preferably, the high dielectric layer is deposited with a thickness of 50 nm~150 nm by the PEALD process or the ALD process, thereby forming a double layer with the plasma oxide layer. When the plasma oxide layer is grown, a plasma pulse can be discontinuously and directly supplied. The plasma pulse supplying method includes RF, electron cyclotron resonance (ECR), ion plating (IP), etc.

As necessary, the gate dielectric layer has a tri-laminar structure. In more detail, the plasma oxide layer 2 is first formed, the ALD oxide layer 3 is formed on the plasma oxide layer 2 by the PEALD process, and the high electric layer 4 is formed on the ALD oxide layer 3. Generally, when the high dielectric layer having a high dielectric constant is deposited, device characteristic is likely to be deteriorated because of incompatibility with silicon. For this reason, the ALD oxide layer can be deposited after the plasma oxide layer is finely formed by oxygen plasma and nitrogen plasma.

On the other hand, the foregoing processes are performed in one chamber or in two or more chambers connected to a load lock chamber so as to keep a vacuum state thereof constant because it is difficult to get a high quality gate dielectric layer when the vacuum is broken.

Figure 3:
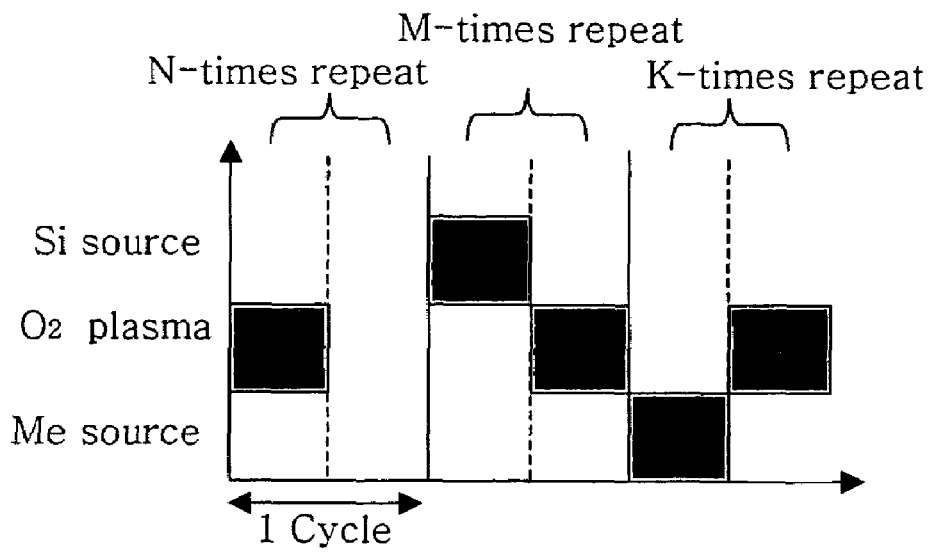
FIG. 3 is a view illustrating a gate dielectric layer having a tri-laminar structure according to an embodiment of the present invention.

FIG. 3 is a view illustrating a gate dielectric layer having a tri-laminar structure according to an embodiment of the present invention.

First, oxygen plasma is generated and forms the plasma oxide layer, wherein the oxygen plasma is discontinuously supplied as a pulse. That is, if a state that the plasma is supplied is represented as "on", otherwise "off", "on" and "off" are alternated like "on/off/on/off . . . ." In the case of the plastic substrate, this discontinuous pulse minimizes deformation of the plastic substrate due to the continuous plasma supplying. This principle is disclosed in "Electrochemical and Solid-state Letters, 8, to be published in January, Sun Jin Yun et al. 2004."

For example, a gate dielectric layer having the tri-laminar structure and used in an N-channel metal oxide semiconductor (NMOS) for a thin film transistor (TFT) will be described hereinbelow.

First, only oxygen plasma is generated on a substrate having poly silicon in the uppermost region, thereby forming a natural oxide layer with a thickness of 5 nm. In FIG. 3, one cycle means that the plasma is generated for four seconds and purged for six seconds. Further, one cycle is performed N-times (e.g., 200~400 cycles). That is, the natural oxide layer having a thickness of 5 nm can be formed when one cycle is N-times performed.

Then, a silicon source reacts to the oxygen plasma during a PEALD process. For example, M-times is 600~800 cycles, so that the ALD oxide layer is formed with a thickness of 15 nm. A purging period is not shown in FIG. 3, but actually exists.

Then, the high dielectric layer is formed. "Me" means a metal material for the high dielectric layer. For example, in the case of the titanium oxide ($TiO_2$) and the aluminum oxide ($Al_2O_3$), "Me" indicates titanium (Ti) and aluminum (Al), respectively. Here, to deposit the aluminum oxide ($Al_2O_3$) having a thickness of 50 nm by the PEALD process, K-times is about 315 cycles.

Meanwhile, all foregoing processes are performed in one chamber at a temperature is 150° C. Further, the whole layer thickness is about 70 nm.

COMPARATIVE EXAMPLE

Figure 4:
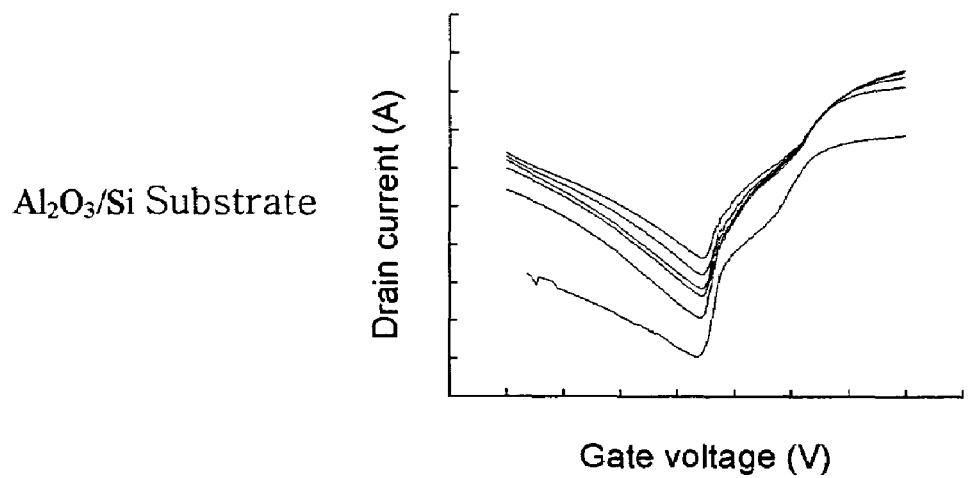
FIG. 4 shows characteristic graphs of a thin film transistor using a Al2O3 gate dielectric layer formed on a single crystal silicon substrate at a temperature of 150° C. by a plasma-enhanced atomic layer deposition (PEALD) process, and a thin film transistor having an atomic layer deposition (ALD) oxide layer added between the $Al_2O_3$ gate dielectric layer and the single crystal silicon substrate.
Figure 4:
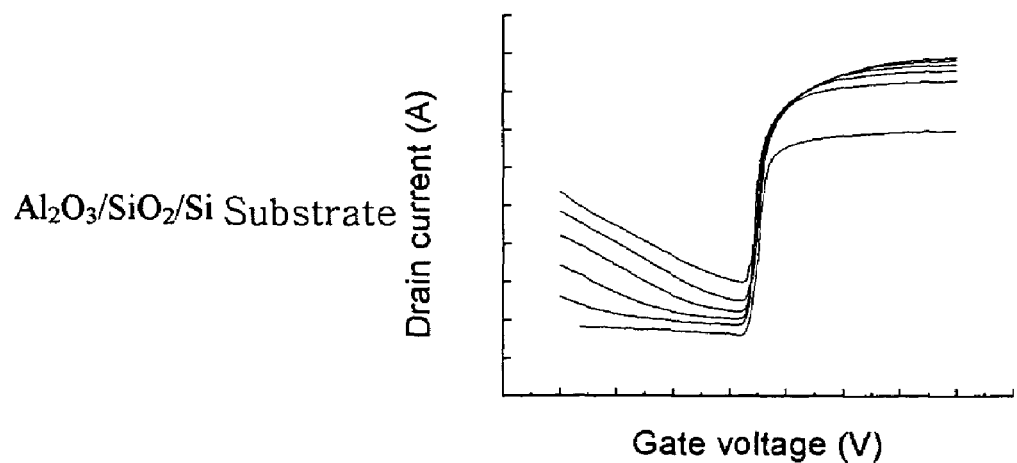

FIG. 4 shows characteristic graphs of a thin film transistor using a $Al_2O_3$ gate dielectric layer formed on a single crystal silicon substrate at a temperature of 150° C. by the PEALD process, and a thin film transistor having a plasma oxide layer added between the PEALD $Al_2O_3$ gate dielectric layer and the single crystal silicon substrate. The thin film transistor was an NMOS device. In the case that the $Al_2O_3$ gate dielectric layer was formed on the single crystal silicon substrate, the $Al_2O_3$ gate dielectric layer had a thickness of 100 nm. Oppositely, in the case that the plasma oxide layer was added between the $Al_2O_3$ gate dielectric layer and the single crystal silicon substrate, the plasma oxide layer had a thickness of 20 nm and the PEALD $Al_2O_3$ gate dielectric layer had a thickness of 80 nm.

Referring to FIG. 4, as for a drain current with respect to a gate voltage, good results were shown in the case where the plasma oxide layer is added. That is, in the case where the high dielectric layer was directly deposited on the silicon, electron mobility, on/off-currents ratio, sub-threshold voltage, threshold voltage, etc. were deteriorated as compared with the double structure of the thermal oxide layer and the high dielectric layer. Further, characteristic due to the interface between the oxide layers was not shown. Therefore, the interface formation of the plasma oxide layer is important in fabricating the device. Further, the device can have high performance regardless of the low temperature process.

Figure 5:
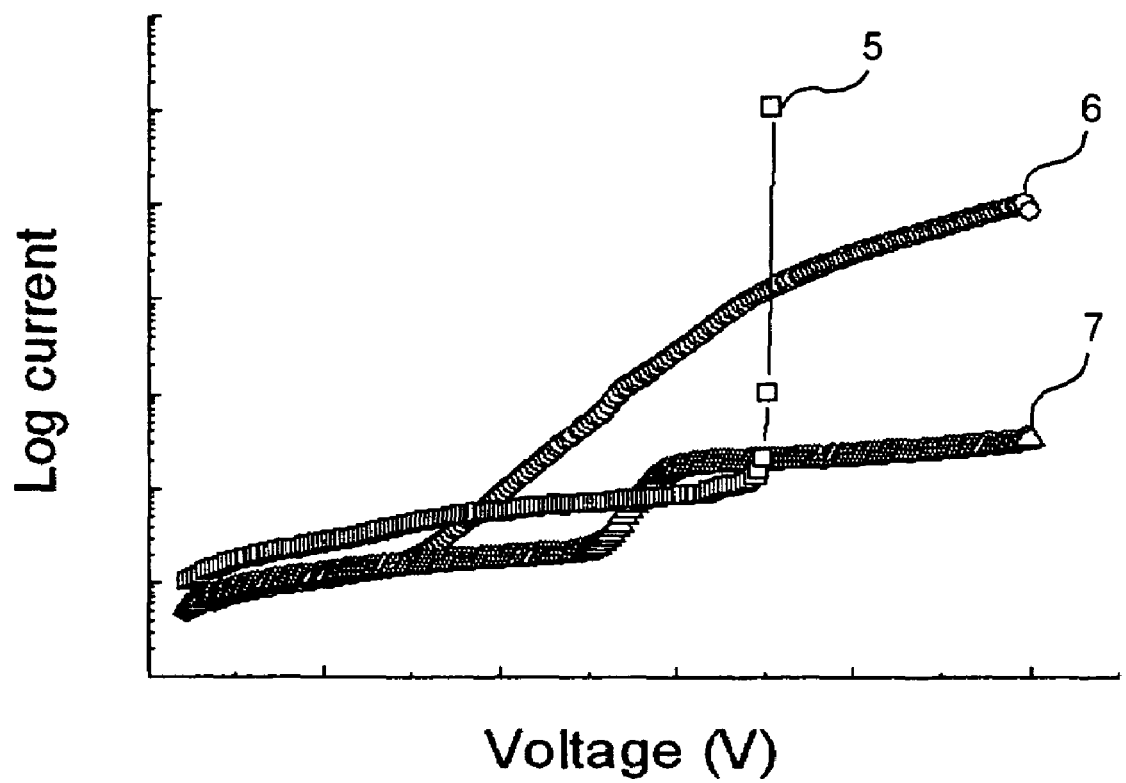
FIG. 5 shows a current-voltage graph showing the characteristic of sample gate dielectric layers.

FIG. 5 shows a current-voltage graph showing the characteristic of sample gate dielectric layers.

Here, on a Si substrate, a dielectric layer was formed thereon with a thickness of 100 nm, and an aluminum electrode was formed on the dielectric layer. In FIG. 5, a reference numeral of 5 indicates a single alumina layer; a reference numeral of 6 indicates a silicon oxide layer grown by a low-temperature CVD process; and a reference numeral of 7 indicates a dielectric layer having a double structure of a plasma oxide layer and the alumina. Further, the deposition of the dielectric layer had the same conditions as the deposition of FIG. 4, and was performed at a temperature of 150° C.

Hence, the dielectric layer having the dual structure of the plasma oxide layer and the $Al_2O_3$ thin film had a low current-leakage and a high dielectric breakdown field.

As described above, the present invention provides a method of forming a gate dielectric layer having good characteristic at a low temperature of 200° C. or below. Thus, the gate dielectric layer according to the present invention can be applied to a display device comprising a substrate such as a plastic substrate vulnerable to heat. Further, the gate dielectric layer according to the present invention can be applied to forming a dielectric layer requiring a low temperature, have good interfacial characteristic, and allow a high dielectric layer to be applied thereto, thereby enhancing the whole characteristics of the device.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A method for forming a gate dielectric layer, the method comprising:
    forming a plasma oxide layer on silicon by plasma at a temperature of 200° C. or below;
    depositing an atomic layer deposition (ALD) oxide layer by any one of an atomic layer deposition (ALD) process and a plasma enhanced atomic layer deposition (PEALD) process at a temperature of 200° C. or below, and
    forming a high dielectric layer after depositing the ALD oxide layer,
    wherein forming the plasma oxide layer and depositing the ALD oxide layer occur by in-situ processing.

2. The method as claimed in claim 1, wherein the high dielectric layer includes aluminum oxide ($Al_2O_3$), titanium oxide ($TiO_2$), tantalum oxide ($Ta_2O_5$), hafnium oxide ($HfO_2$), zirconium oxide ($ZrO_2$), or a silicate layer formed by combination of silicon dioxide ($SiO_2$) and at least one of the $Al_2O_3$, $TiO_2$, $Ta_2O_5$, $HfO_2$, $ZrO_2$.

3. The method as claimed in claim 1, wherein the plasma oxide layer, the ALD oxide layer, and the high dielectric layer are deposited by in-situ.

4. The method claimed in claim 1, wherein the plasma oxide layer has a thickness of 2 nm to about 10 nm, and the ALD oxide layer has a thickness of 50 nm to about 150 nm.

5. A method for forming a gate dielectric layer, the method comprising:
    forming a plasma oxide layer on silicon by plasma at a temperature of 200° C. or below; and
    depositing a high dielectric layer by any one of an atomic layer deposition (ALD) process and a plasma enhanced atomic layer deposition (PEALD) process at a temperature of 200° C. or below,
    wherein forming the plasma oxide layer and depositing the high dielectric layer occur by in-situ processing, and
    wherein, during the process for forming the plasma oxide layer on silicon by plasma, the plasma is provided discontinuously where a state of plasma and a state of without plasma are repeated alternately.

6. The method as claimed in claim 5, wherein the high dielectric layer includes aluminum oxide ($Al_2O_3$), titanium oxide ($TiO_2$), tantalum oxide ($Ta_2O_5$), hafnium oxide ($HfO_2$), zirconium oxide ($ZrO_2$), or a silicate layer formed by combination of silicon dioxide ($SiO_2$) and at least one of the $Al_2O_3$, $TiO_2$, $Ta_2O_5$, $HfO_2$, $ZrO_2$.

7. The method claimed in claim 5, wherein the plasma oxide layer has a thickness of 2 nm to about 10 nm, and the ALD oxide layer has a thickness of 50 nm to about 150 nm.

8. The method as claimed in claim 5, wherein the silicon includes any one of the poly silicon and amorphous silicon.

9. The method as claimed in claim 8, wherein the silicon is formed on a plastic substrate.

10. A method for forming a gate dielectric layer, the method comprising:
    forming a plasma oxide layer on silicon by plasma at a temperature of 200° C. or below; and
    depositing, directly on the plasma oxide layer, a high dielectric layer by any one of an atomic layer deposition (ALD) process and a plasma enhanced atomic layer deposition (PEALD) process at a temperature of 200° C. or below,
    wherein forming the plasma oxide layer and depositing the high dielectric layer on the plasma oxide layer occur by in-situ processing, and
    wherein during the process for forming the plasma oxide layer on silicon by plasma, the plasma is provided discontinuously where a state of plasma and a state of without plasma are repeated alternately.

11. The method as claimed in claim 1, wherein during the process for forming the plasma oxide layer on silicon by plasma, the plasma is provided discontinuously where a state of plasma and a state of without plasma are repeated alternately.

12. The method as claimed in claim 1, wherein the atomic layer deposition (ALD) oxide layer is formed by the plasma enhanced atomic layer deposition (PEALD) process and during the plasma enhanced atomic layer deposition process for forming the ALD oxide layer, the plasma is provided discontinuously where a state with plasma and a state without plasma are repeated alternately.

13. The method as claimed in claim 1, wherein the high dielectric layer after depositing the atomic layer deposition oxide layer is formed by a plasma enhanced atomic layer deposition (PEALD) process.

14. The method as claimed in claim 13, wherein during the plasma enhanced atomic layer deposition (PEALD) process for forming the high dielectric layer, the plasma is provided discontinuously where a state with plasma and a state without plasma are repeated alternately.

15. The method as claimed in claim 5, wherein the high dielectric layer is formed by the plasma enhanced atomic layer deposition (PEALD) process and during the plasma enhanced atomic layer deposition process for forming the high dielectric layer, the plasma is provided discontinuously where a state with plasma and a state without plasma are repeated alternately.

* * * * *